United States Patent [19]

Robinson

[11] 4,403,410
[45] Sep. 13, 1983

[54] MANUFACTURE OF PRINTED CIRCUIT BOARDS

[75] Inventor: John E. Robinson, Dukinfield, England

[73] Assignee: International Computers Limited, London, England

[21] Appl. No.: 225,092

[22] Filed: Jan. 14, 1981

[30] Foreign Application Priority Data

Jan. 23, 1980 [GB] United Kingdom ............... 8002345

[51] Int. Cl.³ .............................................. A05K 3/36
[52] U.S. Cl. ..................................... 29/830; 174/68.5; 228/104; 228/180 A
[58] Field of Search ................. 29/825, 832, 830, 407; 228/103, 104, 180 A; 174/68.5; 324/73 PC

[56] References Cited

U.S. PATENT DOCUMENTS

| 3,795,047 | 3/1974 | Abolafia et al. | 29/830 X |
| 4,056,773 | 11/1977 | Sullivan | 324/73 PC |
| 4,187,339 | 2/1980 | Cayrol | 174/68.5 X |
| 4,191,789 | 3/1980 | Brown et al. | 174/68.5 X |
| 4,211,603 | 7/1980 | Reed | 174/68.5 X |

FOREIGN PATENT DOCUMENTS 1456994 12/1976 United Kingdom ............... 29/830

OTHER PUBLICATIONS

Hughes Industrial Products Div., pp. 1–24, May 1978, (Literature on Hughes Prod. Equipment).
IBM Tech. Discl. Bull., vol. 8, No. 11, Apr. 1966, p. 1469, Article by Mutnick.
IBM Tech. Discl. Bull., vol. 11, No. 8, Jan. 1969, p. 962, Article by Hermann.

Primary Examiner—Gene Crosby
Assistant Examiner—Carl J. Arbes
Attorney, Agent, or Firm—Hane, Roberts, Spiecens & Cohen

[57] ABSTRACT

A process for the manufacture of a printed circuit board is disclosed in which, during the process, conductive tracks 6 are tested for defects 8 relating to their conductivity and any detected defect 8 is repaired by securing a conductive bridge-piece 9 across the defect 8 by a reflow soldering operation. The repair is encapsulated with a protective layer 16 and the manufacturing process, which includes the further application of heat to the circuit board, is continued.

5 Claims, 5 Drawing Figures

MANUFACTURE OF PRINTED CIRCUIT BOARDS

This invention relates to the manufacture of printed circuit boards.

In the manufacture of printed circuit boards layers of conductive material are formed in desired patterns. Defects can occur in the formation of the patterns, the most common kind being an open circuit. The problem is especially acute in boards, such as are used in advanced electronic equipment, in which the conductive patterns include complex patterns of narrow strips, referred to herein as "tracks". It is then possible for a significant proportion of boards to have at least one defect. If defective boards must be scrapped the manufacturing process is rendered much less economic. There is therefore a need for techniques for repairing defects arising during manufacture.

However, the repair must be capable of withstanding the subsequent operations used in the manufacture of the boards. Many of these operations used in the manufacture of the boards. Many of these operations involve not only mechanical handling, but also heat. For example, components are commonly attached to the board by flow or dip soldering. In these processes the board is subjected to contact with molten solder. And if the board is a multilayer board formed by bonding together several sheets carrying layers of conductive material in required patterns, a repair to one of these layers will usually be subjected to both heat and pressure during the bonding operation.

It is known that satisfactory repairs to printed circuit tracks on the surface of a printed circuit board can be made by resistance welding. By welding is meant a process for bonding metals in which the metals are heated to the point at which they soften or melt in order to form the bond. By resistance welding is meant a welding process in which the heat required is supplied by the resistance-heating effect of a current passing through the region to be bonded. For example machines are available commercially for repairing copper printed-circuit tracks by resistance-welding strips of Kovar (an alloy consisting of 17% cobalt, 29% nickel and 53% iron) to the tracks. Temperatures of over 1000° C. are required to weld the Kovar strips and the resulting bond is able to withstand the subsequent operations that are conventionally applied to the board, including those in which heat is applied. But there are disadvantages to welding. The high temperatures required tend to melt or otherwise damage the base layer on which the conductive track is carried. And the process is very sensitive to the correct adjustment of the amount of energy used in carrying out the weld.

Furthermore, welding has been found to introduce a high resistance in the circuit track which, in some instances, can produce unacceptable voltage drops across the repaired section.

The invention provides a process for the manufacture of a printed circuit board assembly which includes the steps of: forming on a sheet of insulating material a conductive layer comprising at least one conductive path; testing the conductive path to detect the presence of a defect denoting an imperfection in its conductivity; repairing the conductive path to remedy any detected defect by securing a conductive bridge-piece across the defect by a reflow soldering operation, and encapsulating that area of the conductive path including the repair with a protective layer: prior to continuing the manufacturing process in which subsequent manufacturing steps include the application of heat to the sheet of insulating material and conductive path in the vicinity of the repair.

By reflow soldering is meant a process for bonding two metals in which at least one of the metals is coated with a layer of solder before the metals are placed together and heat is applied to melt the solder layer, which, when it solidifies, bonds the metals. A solder is a metal or metal alloy which melts at less than 800° C., and normally at less than 400° C. It is known as a technique for attaching components to printed circuit boards. The solder, if an alloy, may be originally present in the coating as a particulate mixture of the constituents.

We have found surprisingly, that a repair of a printed-circuit track or other conductive path effected by a bridge-piece bonded by reflow soldering will withstand the conventional operations used in the manufacture or treatment of the board, including those involving the application of heat, even though the temperatures used may be comparable to those used in the reflow soldering. The process may be applied to repairing a conductive path in an inner layer of a multilayer circuit, the multilayer board being subsequently bonded out of individual sheets under heat and pressure. It may also be applied to repairing a conductive path in an outer layer, the board being subsequently subjected to contact with molten solder in bulk.

We have found that the reflow soldering repair technique of the invention is less likely than welding to damage the base layer on which the conductive layer is carried. It is also much less sensitive than welding to the amount of energy used to effect the repair.

Preferably the repair step is carried out by placing the bridge-piece in position, bringing a heater element into contact with the bridge-piece so as to contact it over the whole of its length and heating the heater element so as to melt the solder coating or coatings in the region to be bonded, preferably by the applications of a predetermined quantity of energy, and advantageously by passing an electric current through the heater element.

Preferably the conductive path, at least immediately to one side of the defect, is a track of not more than 0.02 inches (0.05 mm) in width. The bridge-piece may be less than 0.25 inches (6.25 mm) in length.

The repair may be encapsulated by protective material before the application of heat in the subsequent processing.

The invention also provides a printed circuit board manufactured, or manufactured and treated, in accordance with the method of the invention. It further provides apparatus for carrying out the repair step specified above.

One method in accordance with the invention will now be described in greater detail by way of example with reference to the accompanying drawings, in which FIG. 1 is a diagrammatic view of a fragment of a sheet carrying inner conductive layers;

The process uses many operations which are conventional in the manufacture of printed circuit boards and which consequently will not be described in detail. The essential novelty resides in the method used during the manufacture of the printed circuit boards to repair defects that arise. This repair method may be used in the manufacture of many different types of printed circuit board, but it will initially be described, for convenience, in relation to one particular type of multilayer printed circuit board.

A printed circuit board has a number of conductive layers, that is layers each of conductive material formed in a required pattern. If the board is a multilayer board some at least of these layers are buried in the interior of the board rather than formed on the surface. In the manufacture of the particular board being described the first stage is to form the inner conductive layers. They are carried on individual sheets which are then bonded into a single composite board.

Figure 1:
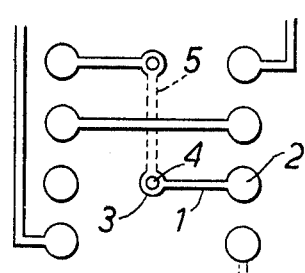

Referring to FIG. 1, one type of sheet carrying conductive layers which become inner layers in the final composite board is manufactured as a double sided board having a conductive layer on each surface. In FIG. 1 the pattern of the layer on the upper side of the sheet is shown by solid lines and the pattern of the layer on the underside is shown by dotted lines. These patterns consist of tracks, that is, narrow strips of conductive material, ending in pads, that is, circular areas of conductive material. For example, a track 1 ends in a pad 2, the two together forming part of the same conductive path. The tracks in the two conductive layers are, in this board, connected to each other where desired by plated through holes made in the sheet carrying the two layers. For example, at the other end of the track 1 to the pad 2 is a smaller pad 3 which is connected by a plated through hole 4 to a matching pad on the underside of the sheet. That in turn is connected to a track 5.

The formation of the patterns of the conductive layers on either side of a sheet such as that shown in FIG. 1 and the plating of the holes is carried out by any suitable method. What follows is one example of a suitable method. The sheet is manufactured from a laminate consisting of insulating material clad on both surfaces with copper foil. This laminate is drilled in positions where plated through holes are required. The surfaces of the laminate and the walls of the holes are then coated by electroless deposition, after which a layer of photo-resist is applied to each surface and exposed to light in contact with a positive of the required pattern. The resist is developed where exposed to light and the undeveloped resist removed, leaving copper in the desired pattern exposed and the remainder masked by developed resist. The pattern and the coating on the walls of the holes are then built up to the required thickness by electro-plating and protected by an etch resist. The photo-resist and underlying copper are then etched away and the etch resist in turn removed, leaving a layer of copper in the desired pattern on each face of the laminate and the patterns connected by plated through holes.

To form the composite board, one or more of such sheets are stacked, together with other sheets carrying conductive layers which, instead of carrying tracks, act as ground or power distribution planes. The two outer sheets each have an outer surface which at this stage is still uniform copper foil.

The sheets of the stack are interleaved with sheets of prepreg, that is glass-fibre sheets impregnated with partially cured epoxy resin. The stack is placed in a press, put under pressure and heated, which completes the curing of the pre-pregs and bonds the stack into a single composite board. The plated through holes made in the sheets carrying the internal conductive layers are now buried in the composite board.

The resulting board is treated to form the outer layers in the required patterns in much the same way as were the individual sheets carrying the inner layers. Holes are drilled through the board in each position in which there is a blank pad such as the pad 2, and the holes are plated and the patterns formed as before, except that the final coating on the conductive pattern and the walls of the holes is a tin-lead solder, applied, for example, electrolytically or mechanically. It may form the final etch resist, instead of the photo-mechanical resist used for the inner layers.

After the unwanted copper has been removed from the surfaces of the board by etching, leaving the desired patterns on the outer surfaces, the outer solder coating is caused to flow. For example, the board may be passed through a reflow machine containing an infra-red heater which causes the solder composition to melt and form a uniform mixture which flows and coats the edges of the copper patterns as well as their top surfaces and the walls of the holes.

The plated through holes made in the final board serve two purposes: to connect conductive layers that were not originally formed as top and bottom of the same sheet, and to receive the leads of components.

Surface mounted components are then inserted in the board with leads in the required holes and the board is passed through a flow-soldering machine. In a flow-soldering machine the underside of the board (the surface away from the components) is passed over a wave of molten solder, which rises up the holes of the board by capillary attraction and solders the component leads in their holes. This process is assisted by the fact that the walls of the holes are already coated in tin-lead solder mixture by the final step of the operation for forming the outer conductive layers.

In a modern printed-circuit board with large numbers of fine tracks—the type of board that is especially likely to use a complex inner-layer structure such as the one described—there is a significant risk that a conductive layer will have one or more defects. It is not impossible, for example, using tracks of 0.006 inches (0.15 mm) width for 20% or more of layers to have one or more defects. The principal defect is a complete break in a track causing an open circuit, but other possible defects are a partial break in a track or a failure of a track properly to contact a pad. These defects arise for instance, from flaws in the material of the resists, or in their exposure and developing or from failures in etching or plating.

In order to discover if defects are present, each conductive layer is checked at the time it is formed. Each inner layer is checked before the sheet carrying it is bonded into the final board, and each outer layer is checked when formed on the final board. To carry out this checking each conductive path is tested electrically, and if it is found to have a resistance greater than a threshold value, indicating a partial break, or if the resistance is infinite, indicating an open circuit, that path is examined usually through a microscope to locate the defect. The defect is then repaired before manufacture of the board continues.

Figure 2A:
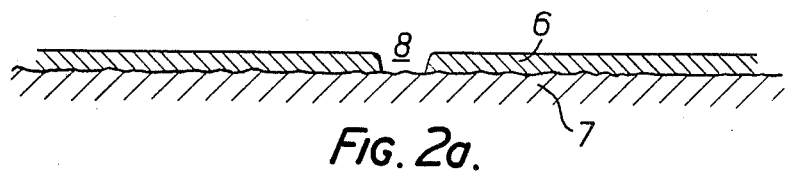
FIG. 2a is a section through a printed circuit track having an open circuit.
Figure 2B:
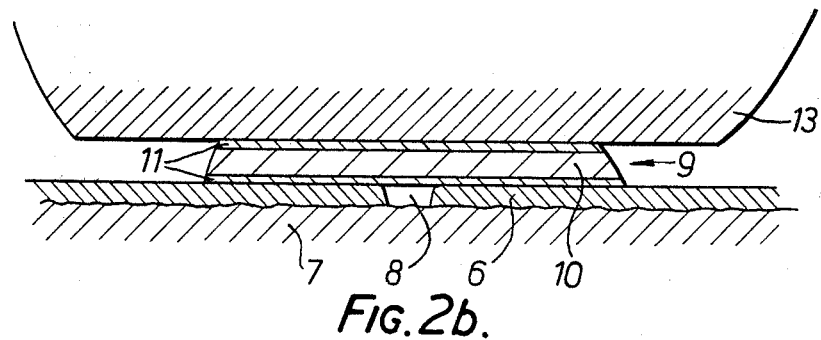
FIG. 2b is a section through the track of FIG. 2a during the repair step.

The repair will be described with reference to FIG. 2, which shows at different stages the repair of a track 6 carried on a base insulating layer 7. The track 6 has been found to have a defect 8 consisting of an open-circuit break (see FIG. 2a). To repair the defect, flux is first applied to the area of the break. Then (see FIG. 2b) bridge-piece 9 consisting of a strip of copper 10 with a coating 11 of tin-lead solder is placed across the defect and bonded to the track 6 by reflow soldering.

Figure 3:
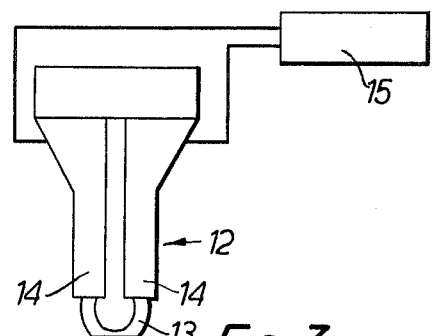
FIG. 3 is a view of the heater element of the machine for carrying out the repair step, together with a diagrammatic representation of the remainder of the machine.
Figure 2C:
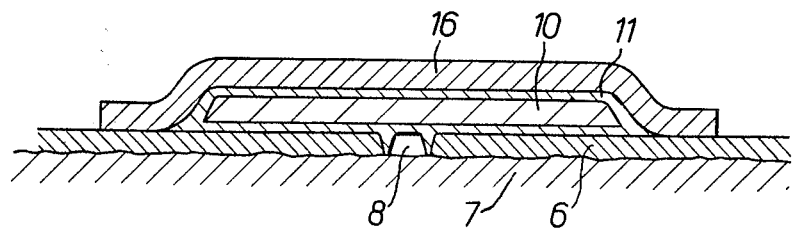
FIG. 2c is a section through the track following the repair step.

Referring to FIG. 3, the reflow soldering is carried out by a machine having a head 12 consisting of a heater element 13 connected between a pair of electrodes 14. The electrodes 14 are connected to a power supply 15. In operation the head 12 (shown in FIG. 2b) is lowered by the action of a foot pedal until a part of the head comes into contact with a bottom stop. At this point the heater element 13 is in contact with the bridge piece 9, variations in thickness of the track or the sheet carrying it being compensated by packing sheets beneath it. The power supply 15 is then activated to apply a voltage pulse of a preset magnitude and duration to the electrodes 14, which causes a current to pass through the heater element 13 and heat it under the effect of its resistance. As a result the solder coating 11 melts. At the end of the voltage pulse the solder solidifies bonding the bridge piece 9 to the track 6 on both sides of the open circuit 8. With the head 12 still in position to protect the repair, solidified solder debris is brushed away and the head 12 then raised. The area of the repair is cleaned to remove flux residues and the repair is encapsulated by a protective layer 16. The open-circuit is now repaired, as shown in FIG. 2c.

If the repair is to an inner layer the track 6 is of copper. If the repair is to an outer layer the track 6 has a copper base layer coated with a deposited mixture of tin and lead. In the latter case the heat used to reflow the solder also reflows the tin-lead mixture, and the copper of the bridge-piece 9 is bonded to the copper base layer by solder originating from both the track and the bridge-piece 9.

When the repair has been made, the manufacture of the board continues in the manner described previously, and, as explained, a number of the steps involve subjecting the repaired layer to heat. Thus, repairs to the inner layer are subjected to the heat required to bond a multilayer board from separate sheets. Repairs to both inner and outer layers are subjected to the heat used to reflow the outer tin-lead coating, and also to the heat resulting from the method used to solder components in place.

It would be expected that subjecting the repair to these operations involving heat would impair the effectiveness of the repair, especially since they can require the use of temperatures comparable with or above the melting point of the solder. And the reflow and component-soldering operations inherently require temperatures above the melting point of solder. In some cases at least we believe that the solder of the repair melts during the subsequent processing. Yet, surprisingly, we have found that the repair remains effective. That is in spite of the fact that the repair may be subjected to the pressure used in the bonding process or the physical disturbance occurring during component soldering from passing the board through a flow-soldering machine or in dipping it in molten solder, factors that might be expected to dislodge the bridge-piece and damage the repair.

We find that reflow soldering has a number of advantages over resistance welding as a method of repairing a conductive path in a printed circuit layer. First, the temperature required is much lower—often less than 200° C. against over 1000° C. It is therefore much less likely to damage the insulating base on which the conductive path is carried than welding. Using welding, it usually proves impossible in practice to make a satisfactory repair without melting or possibly even burning the insulating base on which the conductive layer is carried.

Secondly, we have found that the reflow soldering method is much more tolerant in the settings of the machine than the welding method, which also typically uses a machine that delivers a voltage pulse controllable in magnitude and duration. With welding, only a relatively narrow band of settings gives a satisfactory repair to a conductive path or a given thickness: if the duration or magnitude of the pulse is decreased the weld is incomplete; if either is increased the conductive path is ruptured beneath the weld and the insulating base damaged to an unacceptable extent. With reflow soldering a relatively wide range of settings give a satisfactory repair. It is therefore easier to set up the machine initially. Furthermore, we have found that the settings for reflow soldering are much less dependent on the thickness of the conductive path to be repaired than for welding. It is therefore possible to set up a reflow soldering machine to cope with a range of thicknesses of conductive path to be repaired in circumstances where a welding machine would need resetting for each thickness. Resetting wastes operator's time and introduces the possibility of error.

Thirdly, welding is incapable of repairing solder-coated paths, whereas reflow soldering allows such paths to be repaired.

Finally, using the reflow-soldering machine described above, the repair is made in one operation and the bridge-piece bonded uniformly throughout its length. Welding requires two operations (each requiring correct positioning of the work), the first welding the bridge-piece on one side of the defect and the second welding it on the other side of the defect. And with welding the bridge-piece forms free tails beyond the welds which are liable to catch and cause the repair to be damaged, and also to reduce the insulation resistance between layers and tracks if they are excessive in size or raised or distorted laterally.

Printed circuit boards for high-speed circuits are often constructed as multilayer boards with tracks in inner layers adjacent to ground or power planes and forming transmission lines of a desired characteristic impedance. It is found that such a track repaired by the method described will continue to function satisfactorily as a transmission line. An alternative method which has been used to repair a defect in such a track has been to solder a discrete wire to conductors at the surface connected by plated through holes to either end of the defective track. That, however, leaves two sections of the original track, each (in the case of a complete break) with a free end, connected to the circuit, and this is unsatisfactory electrically. It is therefore the practice to drill out the through holes at either end of the defective track, isolating these sections. That will result in any other tracks connected to the same holes also being open circuited and given a free end, and it will be seen that where there is "string" consisting of a sequence of connected tracks each link must be open-circuited and replaced by a discrete wire—an inefficient and wasteful procedure. The method described allows the defective link to be repaired in a single operation. As there is in practice a fairly low limit to the number of discrete wires that may be added to a high-speed board, the method also allows a greater number of defects to be repaired without the need to scrap the board.

The following details of one specific example of the method described with reference to the drawings which has proved satisfactory.

The reflow soldering machine was a modified version of a printed circuit board repair station manufactured by the Hughes Aircraft Company as their Model HPC-500, which normally operates by welding. A molybdenum alloy wire was inserted in holes drilled in the electrodes and formed the heating element. The wire was 0.040 inches (1 mm) in diameter and was filed to a width of approximately 0.025 inches (0.625 mm) in the region where it was applied to the bridge-piece in order to achieve a resistance giving the desired heating effect.

Tracks of 0.006 inches (0.15 mm) width carried on a base layer consisting of an epoxy-glass laminate were repaired using bridge-pieces cut from strips of copper 0.006 inches (0.15 mm) wide and 0.001 inches (0.025 mm) thick made by electroforming and coated by dipping in hot 60%-40% tin-lead solder of a melting point of 183° C., the weight of solder coating averaging 5 milligrams per 10 inches (25 cm) (commercially available solder-coated copper strip is also suitable). Tracks of up to 0.014 inches (0.35 mm) could be repaired using a similar strip 0.010 inches (0.25 mm) in width. For an open circuit consisting of a gap 0.03 inches (0.075 mm) long a bridge-piece 0.200 inches (5 mm) long was used. The total thickness of the solder layers above and below the bridge-piece in the completed repair amounted to some 0.0001 inches (0.0025 mm).

Before the repair was made, resin flux Alpha 711.35 was applied to the area of the defect by brushing. (Alternatively, one or two-part epoxy fluxes may be applied from a dispenser). After the repair has been made it was cleaned with Arklone (a registered trade mark of Imperial Chemical Industries Limited). Inner-layer repairs were encapsulated in Corfil, an unsupported 'B' stage resin supplied by Fortin Ltd., sealed by use of a warm iron. A 'B' stage resin is a partially cured resin which is curable under the action of heat and pressure. The resin was compatible with the prepreg used for bonding the board. Outer layer repairs were encapsulated in a solder resist.

The following machine settings gave satisfactory repairs on copper tracks 0.006 inches (0.15 mm) wide and thicknesses of 0.0007 inches (0.0175 mm), 0.0014 inches (0.035 mm) and 0.0020 inches (0.05 mm), and also a solder-coated outer track of 0.0024 inches (0.06 mm).

Electrode force—7 ounces (198 grams)
  Electrode Volts DC—0.41 V
  Duration of voltage pulse—0.480 secs Three different settings would be needed to make repairs to these thicknesses of copper track by welding. The solder coated track could not have been repaired. As a further illustration of the tolerance of a reflow soldered repair, the following settings were equally satisfactory to those given above for a 0.0007 inches (0.0175 mm) thick track.

Electrode force—7 ounces (198 grams)
  Electrode Volts DC—0.38 V
  Duration of voltage pulse—0.200 secs The resulting repairs withstood normal cleaning and handling, bonding into a multilayer board at 116° C. under several tons pressure and repeated passages through a flow-solder machine.

So far it has been assumed that the method described with reference to the drawings has been applied to a particular type of multilayer board. But, as explained, the method is not so limited. For example, the board may be double or single sided rather than multilayer, or if multilayer need not have plated through holes buried in the interior. The conductive patterns may, if appropriate, be formed in other ways, such as wholly by etching or wholly by plating. If plating is used (whether alone, or, as previously described, on top of a layer of conductive foil) it may take place entirely by an electroless process, or electroplating may follow an electroless process.

The encapsulation of the repair is desirable to protect the repair, but may, we believe, be omitted in suitable circumstances.

When repairing a conductive path already coated in solder or a solder mixture the bridge-piece need not itself be coated.

As well as repairs to a track, the method described can be used to make a join between a track and a pad if the track fails to make any, or proper, contact to the pad.

We have found that open circuits usually occur either as a relatively small break, or as a rather longer break of a quarter of an inch or more. In the latter case the defect may be repaired by using a longer bridge-piece and two separate operations of the flow-soldering machine, each attaching an end of the bridge-piece to the track on either side of the defect.

Other conductive materials than copper strip may be used for the bridge-piece and other solders than tin-lead. However, it is necessary that in the repair there should be an adequate metallurgical bond between the bridge-piece and the solder and between the material of the conductive path and the solder. Such a bond may be recognised, if the repair is sectioned, by the absence of any division between the materials being bonded. It provides the necessary physical strength and electrical continuity. It is to be understood that the term "bond" is used herein in relation to the making of the repair to mean a bond having these characteristics. It is thought that in such a bond diffusion of the molecules of each material into the other takes place. Kovar coated with tin-lead solder is an example of a material which does not, in our experience, give an adequate metallurgical bond if an attempt is made to use it as a bridge-piece in the method described with reference to the drawings.

I claim:

1. A process for the manufacture of a printed circuit board assembly including the steps of manufacturing a printed circuit board by forming a conductive layer comprising at least one conductive track on a sheet of insulating material; testing each such conductive track for electrical continuity to detect any defect in the continuity of the track; repairing the detected defect by providing a strip of electrically conductive material of a length sufficient to bridge the defect and overlap the track on both sides of the defect, positioning the strip to bridge the defect with its ends overlapping the track with a layer of solder interposed between the strip and the track; applying heat to cause the solder layer to reflow so that on cooling the strip is bonded to the track and is effective to repair the defect in electrical continuity of the track; and thereafter performing further steps in the manufacture of the assembly during which the repaired printed circuit board is subjected to heating to a temperature at which the solder melts.

2. A process as claimed in claim 1 including the step of applying a coating of insulating material to the printed circuit board in the vicinity of the strip bonded to the track effective to encapsulate and protect the strip and solder bond.

3. A process as claimed in claim 1 in which the strip of conductive material is coated with the layer of solder.

4. A process as claimed in claim 1 in which heat is applied to reflow the solder layer by means of a heating element brought into contact with the whole length of the strip and through which element a predetermined electric current is passed.

5. A process as claimed in claim 1 in which the further steps include the steps of stacking the printed circuit board with a plurality of further printed circuit boards and subjecting the stack to pressure and heat to form a composite multilayer printed circuit board.

* * * * *